(12) United States Patent
Kim et al.

(10) Patent No.: US 12,089,452 B2
(45) Date of Patent: Sep. 10, 2024

(54) DISPLAY DEVICE

(71) Applicant: LG Display Co., Ltd., Seoul (KR)

(72) Inventors: JunSu Kim, Gumi-si (KR); YoungSik Kim, Jinju-si (KR); Junggyu Lee, Seoul (KR); ByoungHyun Koo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 45 days.

(21) Appl. No.: 17/084,421

(22) Filed: Oct. 29, 2020

(65) Prior Publication Data

US 2021/0134912 A1 May 6, 2021

(30) Foreign Application Priority Data

Nov. 1, 2019 (KR) .................. 10-2019-0138620
Nov. 1, 2019 (KR) .................. 10-2019-0138627

(51) Int. Cl.
*H10K 59/124* (2023.01)
*H10K 50/844* (2023.01)
*H10K 59/122* (2023.01)
*H10K 77/10* (2023.01)

(52) U.S. Cl.
CPC ......... *H10K 59/124* (2023.02); *H10K 50/844* (2023.02); *H10K 59/122* (2023.02); *H10K 77/10* (2023.02)

(58) Field of Classification Search
CPC ............ H01L 27/3258; H01L 27/3246; H01L 51/5253; H01L 51/5246; H01L 51/0096; H04M 1/0266; H04M 1/0264; H04M 1/18; G06F 1/1637; G06F 1/1626; G06F 1/1686; H10K 50/844; H10K 50/8426; H10K 59/12; H10K 59/124; H10K 77/10
See application file for complete search history.

(56) References Cited

U.S. PATENT DOCUMENTS

| | | | |
|---|---|---|---|
| 9,632,487 B2 | 4/2017 | Kim et al. | |
| 10,396,311 B2 | 8/2019 | Lee et al. | |
| 10,541,380 B1* | 1/2020 | Sung | ............ H10K 59/124 |

(Continued)

FOREIGN PATENT DOCUMENTS

| | | |
|---|---|---|
| CN | 106409867 A | 2/2017 |
| CN | 109427861 A | 3/2019 |

(Continued)

OTHER PUBLICATIONS

European Patent Office, Extended European Search Report and Opinion, EP Patent Application No. 20200477.6, Mar. 24, 2021, eight pages.

(Continued)

*Primary Examiner* — Vongsavanh Sengdara
(74) *Attorney, Agent, or Firm* — Fenwick & West LLP

(57) ABSTRACT

Provided is a display device. The display device includes a base layer including an active area partitioned to display images and an inactive area adjacent to the active area, an opening located in a part of the active area and passing through the base layer and functional layers thereabove, and a cut structure located in the vicinity of the opening and provided to cut the connection of an organic light emitting layer between the opening and a light emitting unit. A camera may be provided in a position corresponding to the opening.

32 Claims, 10 Drawing Sheets

(56) References Cited

U.S. PATENT DOCUMENTS

| | | | |
|---|---|---|---|
| 2017/0031323 A1 | 2/2017 | Kim et al. | |
| 2017/0148856 A1* | 5/2017 | Choi | .................... H10K 59/124 |
| 2018/0151838 A1 | 5/2018 | Park et al. | |
| 2018/0183015 A1 | 6/2018 | Yun et al. | |
| 2019/0074479 A1* | 3/2019 | Lee | ...................... H10K 50/844 |
| 2020/0365672 A1* | 11/2020 | Choi | .................. H10K 59/1216 |

FOREIGN PATENT DOCUMENTS

| | | | |
|---|---|---|---|
| CN | 110364560 A1 | 10/2019 | |
| EP | 3226101 A1 | 10/2017 | |

OTHER PUBLICATIONS

China National Intellectual Property Administration, Office Action, CN Patent Application No. 202011078511.7, Jun. 19, 2024, 15 pages.

European Patent Office, Extended European Search Report, European Patent Application No. 24172993.8, Aug. 5, 2024, eight pages.

\* cited by examiner

DISPLAY DEVICE

CROSS-REFERENCE TO RELATED APPLICATIONS

This application claims the priority of Republic of Korea Patent Application Nos. 10-2019-0138620 filed on Nov. 1, 2019 and Republic of Korea Patent Application No. 10-2019-0138627 filed on Nov. 1, 2019, in the Korean Intellectual Property Office, the disclosure of each of which is incorporated herein by reference.

BACKGROUND

Field

The present disclosure relates to a display device in which a camera is disposed in an active area.

Description of the Related Art

Display devices express various images using various display elements such as a liquid crystal display device or an electroluminescent display device. Among them, people have tried to find the optimal ratio between the enlargement of a display area and the portability of the display device used in smart phones, and recent display devices utilize the flat area by disposing the camera inside the active area.

In order to dispose the camera in the active area, an opening hole in which the camera is seated needs to be formed. The camera hole is generally formed by a process of irradiating laser beam to remove a part of the active area.

However, during the process of irradiating laser beam to remove a predetermined area in the display device, damages such as crack may be caused, and the damages are transmitted to the active area to degrade an image quality or deteriorate a display element.

SUMMARY

An object of the present disclosure is to provide a structure for disposing an image capturing device, such as a camera, inside the active area. Moreover, another object of the present disclosure is to provide a method of improving vulnerability which may be caused in the placement structure Objects of the present disclosure are not limited to the above-mentioned objects, and other objects, which are not mentioned above, can be clearly understood by those skilled in the art from the following descriptions.

According to an aspect of the present disclosure, a display device is provided. The display device may include a base layer including an active area partitioned to display images and an inactive area adjacent to the active area; an opening located in a part of the active area and passing through the base layer and functional layers thereabove, and a cut structure located in the vicinity of the opening and provided to cut the connection of an organic light emitting layer between the opening and a light emitting unit. A camera may be provided in a position corresponding to the opening.

The cut structure may have a shape to suppress the inorganic layer which covers the cut structure from being laminated while making a valley shape. In this case, the inorganic layer which covers the cut structure may be an inorganic layer included in an encapsulation layer which covers the active area. A side surface inclination of the cut structure may be 65 degrees or smaller. The cut structure has at least two side surface inclination angles, and an inclination angle of a lower portion of the cut structure may be smaller than an inclination angle of an upper portion of the cut structure.

The cut structure may be located between the opening and the light emitting unit of the active area to enclose the opening. An inorganic insulating layer below the cut structure may be etched inwardly from an outer periphery of the cut structure.

The cut structure includes at least two protruding structures, and each of the protruding structures may be formed of the same material as a planarization layer which covers a source electrode or a drain electrode of a thin film transistor TFT included in a pixel circuit of the active area.

The display device may further include an encapsulation layer including a first inorganic layer, an organic layer, and a second inorganic layer sequentially laminated and covers the active area, and a blocking structure provided to block the flow of the organic layer. The cut structure may be located on one side or both sides of the blocking structure. Two blocking structures may be provided and the cut structure may be located between two blocking structures.

According to another aspect of the present disclosure, the display device includes a first area from which a base layer and functional layers thereabove are pierced, a second area which encloses the first area, and a third area which encloses the second area and disposes a pixel, in the second area, a cut structure which is provided to cut the connection of an organic light emitting layer and a crack preventive structure which is adjacent to the cut structure.

According to still another aspect of the present disclosure, the display device may include a base layer which includes an active area partitioned to display images and an inactive area adjacent to the active area, an opening which in a part of the active area and passing through the base layer and functional layers thereabove, and a cut structure adjacent to the opening, and a buffer layer adjacent to a side surface of the cut structure.

Other detailed matters of the exemplary embodiments are included in the detailed description and the drawings.

According to the exemplary embodiments of the present disclosure, a display device in which the vulnerability of the camera placement structure in the active area is improved may be provided. Specifically, according to the exemplary embodiments of the present disclosure, damages and moisture permeation in the vicinity of a camera seating area may be effectively suppressed. Accordingly, the exemplary embodiments of the present disclosure may provide a display device with an improved reliability.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
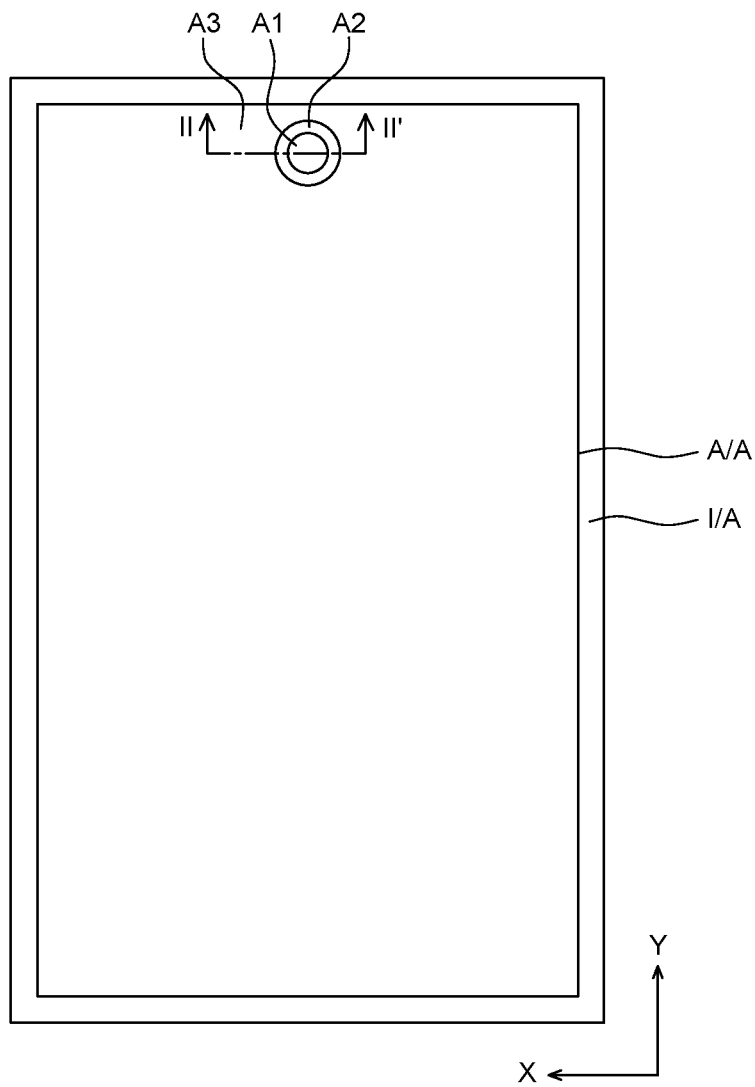
FIG. 1 illustrates an exemplary display device which may be included in an electronic apparatus according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise. Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly". When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 illustrates an exemplary display device which may be included in an electronic apparatus according to an embodiment of the present disclosure.

Referring to FIG. 1, the display device 100 includes at least one active area A/A which is partitioned to display an image and an array of pixels is formed in the active area A/A. One or more inactive areas I/A may be disposed in the vicinity of the active area A/A. That is, the inactive area I/A may be adjacent to one or more side surfaces of the active area A/A. In FIG. 1, the inactive area I/A encloses a rectangular active area A/A. However, a shape of the active area A/A and a shape/placement of the inactive area I/A are not limited to an example illustrated in FIG. 1. The active area A/A and the inactive area I/A may have a shape suitable for a design of an electronic apparatus mounted with the display device 100. An exemplary shape of the active area A/A is a pentagon, a hexagon, a circle, or an ellipse.

Each pixel in the active area A/A may be associated with a pixel circuit. The pixel circuit may include one or more switching transistors and one or more driving transistors on a backplane. Each pixel circuit may be electrically connected to a gate line and a data line in order to communicate with one or more driving circuits such as a gate driver and a data driver located in the inactive area I/A.

The driving circuit may be implemented by a thin film transistor (TFT) in the inactive area I/A. The driving circuit may be referred to as a gate-in-panel (GIP). Further, some components, such as a data driver IC, are mounted on a divided printed circuit board and may be coupled to a connecting interface (a pad, a bump, or a pin) disposed in the inactive area I/A using a circuit film such as a flexible printed circuit board (FPCB), a chip-on-film (COF), or a tape-carrier-package (TCP). The inactive area I/A is bent together with the connecting interface so that the printed circuit (COF, PCB, or the like) may be located on a rear side of the display device 100.

The display device 100 may further include various additional elements to generate various signals or drive the pixel in the active area A/A. The additional element which drives a pixel may include an inverter circuit, a multiplexer, or an electrostatic discharging circuit. The display device 100 may further include an additional element associated with a function other than a pixel driving function. For example, the display device 100 may include additional elements which provide a touch sensing function, a user authentication function (for example, finger print recognition), a multilevel pressure sensing function, or a tactile feedback function. The above-mentioned additional elements may be located in the inactive area and/or an external circuit which is connected to the connecting interface.

The display device 100 may include an area where the camera is seated, in the active area A/A. Due to manufacturing efficiency and/or aesthetic reasons, the size of a display device (especially, a flat area) is often limited. If the area where the camera is seated is provided in the inactive area I/A, a size of the inactive area I/A is increased and a size of the active area A/A is correspondingly reduced. In contrast, if the area where the camera is seated is provided in the active area A/A, a size of the inactive area I/A may be correspondingly reduced so that the size of the active area A/A is maximized or increased.

Therefore, in the display device 100 according to the exemplary embodiment of the present disclosure, an area where an image capturing element such as a camera is disposed is provided in the active area A/A so that the area of the active area A/A may be expanded while reducing the area of the inactive area I/A. Hereinafter, for the convenience of description, the inside of the active area A/A is divided into a first area A1, a second area A2, and a third area A3. Even though in the first area A1 and the second area A2, no image is displayed, the first area A1 and the second area A2 are enclosed by the third area A3 in which image display elements are displayed so that the first area A1 and the second area A2 are classified as an active area A/A in the present disclosure. In the meantime, the first area A1 and the second area A2 may be provided in an arbitrary position on a flat surface so that the position is not limited to that illustrated in FIG. 1.

The first area A1 is a part where an opening is provided so that an image capturing device such as a camera is disposed. The first area A1 is provided in the active area A/A. The first area A1 is an area where the camera is located so that images are not displayed. The first area A1 may have a circular shape or an elliptical shape.

The third area A3 is a part where a pixel is disposed. The pixel is a unit structure which expresses a color (or light). The pixel may include a red sub pixel, a green sub pixel, a blue sub pixel, and a white sub pixel. The pixel includes a light emitting element (light emitting diode) or a device control circuit.

The second area A2 is located between the first area A1 and the third area A3. Since the second area A2 encloses an outer periphery of the first area A1, the second area A2 may have a shape corresponding to the shape of the first area A1, but the shape of the second area A2 is not limited thereto. For example, when the first area A1 has a circular shape, the second area A2 may have a circular shape or an elliptical shape.

The second area A2 separates the first area A1 from the third area A3 so that the first area A1 and the third area A3 are not affected by each other. For example, the second area A2 suppresses an organic light emitting layer and/or an encapsulation layer formed in the third area A3 from permeating into the first area A1. Further, the second area A2 suppress the damage which may be caused when the first area A1 is formed from being transmitted to the third area A3. The second area A2 may include structures for the above-described suppressing function.

Figure 2:
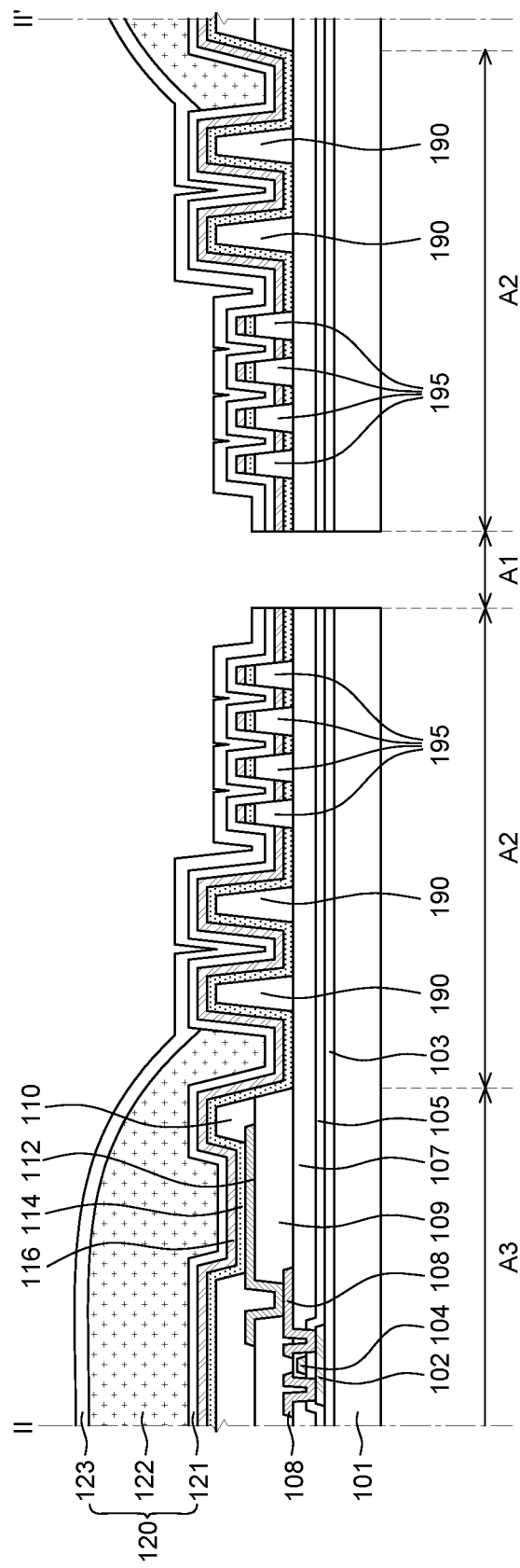
FIG. 2 is a cross-sectional view schematically illustrating a first area, a second area, and a third area of a display device according to an exemplary embodiment of the present disclosure.

FIG. 2 is a cross-sectional view schematically illustrating a first area, a second area, and a third area of a display device according to an exemplary embodiment of the present disclosure.

The first area A1, the second area A2, and the third area A3 illustrated in the drawing may be applied to at least a part of the active area A/A described with reference to FIG. 1. Hereinafter, the areas will be described with an electroluminescent display device as an example. The electroluminescent display device includes an organic light emitting display device and an inorganic light emitting display device.

A base layer 101 and functional layers thereabove corresponding to the first area A1 are removed. Therefore, in the first area A1, a through hole and an image capturing device (not illustrated) are located in a vertical direction. In this case, the removing process may be a punching process using laser. The image capturing device may be located below the base layer 101 in the first area A1.

In the third area A3, thin film transistors (a semiconductor layer 102, a gate electrode 104, and a source and drain electrode 108), organic light emitting elements (a first electrode 112, an organic light emitting layer 114, and a second electrode 116), and various functional layers are located on the base layer 101.

The base layer 101 supports various components of the organic light emitting display device 100. The base layer 101 may be formed of a transparent insulating material, for example, an insulating material such as glass or plastic. A substrate (an array substrate) is also referred to as a concept including elements and functional layers formed on the base layer 101, for example, a switching TFT, a driving TFT, an organic light emitting element, and a passivation layer.

A buffer layer 103 may be located on the base layer 101. The buffer layer is a functional layer for protecting the thin film transistor (TFT) from impurities such as alkali ions which are leaked from the base layer 101 or layers therebelow. The buffer layer may be formed of silicon oxide (SiOx), silicon nitride (SiNx), or multi-layers thereof. The buffer layer 103 may include a multi buffer and/or an active buffer.

The thin film transistor is disposed on the base layer 101 or the buffer layer 103. In the thin film transistor, as illustrated in FIG. 2, a semiconductor layer (active layer) 102, a gate insulator 105, a gate electrode 104, an interlayer dielectric layer 107, and a source and drain electrode 108 may be sequentially laminated. In contrast, in the thin film transistor, a gate electrode, a gate insulator, a semiconductor layer, and source and drain electrodes may be sequentially disposed.

The semiconductor layer 102 may be made of poly silicon (p-Si). In this case, a predetermined region may be doped with impurities. Further, the semiconductor layer 102 may be made of amorphous silicon (a-Si) or various organic semiconductor materials such as pentacene. Moreover, the semiconductor layer 102 may be made of oxide.

The gate electrode 104 may be formed of various conductive materials, for example, magnesium (Mg), aluminum (Al), nickel (Ni), chrome (Cr), molybdenum (Mo), tungsten (W), gold (Au), or an alloy thereof.

The gate insulator 105 and the interlayer dielectric layer 107 may be formed of an insulating material such as silicon oxide (SiOx) or silicon nitride (SiNx) or an insulating organic material. The gate insulator 105 and the interlayer dielectric layer 107 are selectively removed to form a contact hole through which a source and drain region is exposed.

The source and drain electrode 108 may be formed on the gate insulator 105 or the interlayer dielectric layer 107 as a single layer or multi-layers. If necessary, a passivation layer which is configured by an inorganic insulating material may cover the source and drain electrode 108.

A planarization layer 109 may be located on the thin film transistor. The planarization layer 109 protects the thin film transistor and planarizes an upper portion thereof. The planarization layer 109 may be configured to have various shapes. The planarization layer 109 may be modified in various ways, for example, the planarization layer 109 may be formed of an organic insulating film such as benzocyclobutene (BCB) or acryl or an inorganic insulating film such as a silicon nitride film (SiNx) or an silicon oxide film (SiOx) or may be formed of a single layer or double layers or multi-layers.

The organic light emitting element may be formed such that a first electrode 112, an organic light emitting layer 114, and a second electrode 116 are sequentially disposed. That is, the organic light emitting element may be configured by the first electrode 112 formed on the planarization layer 109, the organic light emitting layer 114 located on the first electrode 112, and the second electrode 116 located on the organic light emitting layer 114.

The first electrode 112 is electrically connected to the drain electrode 108 of the driving thin film transistor through the contact hole. When the organic light emitting display device 100 is a top emission type, the first electrode 112 may be formed of an opaque conductive material having high reflectance. For example, the first electrode 112 may be formed of silver (Ag), aluminum (Al), gold (Au), molybdenum (Mo), tungsten (W), chrome (Cr), or an alloy thereof. The first electrode 112 may be an anode of an organic light emitting diode.

The bank 110 is formed in a remaining area except for an emission area. Therefore, the bank 110 has a bank hole which exposes the first electrode 112 corresponding to the emission area. The bank 110 may be made of an inorganic insulating material such as a silicon nitride film (SiNx) or a silicon oxide film (SiOx) or an organic insulating material such as BCB, acrylic resin or imide resin.

The organic light emitting layer 114 is located on the first electrode 112. The organic light emitting layer 114 may include a light emitting layer, an electron injection layer, an electron transport layer, a hole transport layer, and a hole injection layer. The layers may be formed on the entire light emitting unit (the third area) or only in a partial area of the light emitting unit (the third area) depending on the necessity or the process. The organic light emitting layer may be configured with a single light emitting layer structure which emits one light or may be configured with a structure which is configured by a plurality of light emitting layers to emit white light. The organic light emitting layer 114 may not be formed in the first area A1 using a cut structure illustrated in FIGS. 3A and 3B.

The second electrode 116 is located on the organic light emitting layer 114. When the organic light emitting display device 100 is a top emission type, the second electrode 116 is formed of a transparent conductive material such as indium tin oxide (ITO) or indium zinc oxide (IZO) to emit light generated in the organic light emitting layer 114 to an upper portion of the second electrode 116. The second electrode 116 may be a cathode of an organic light emitting diode.

An encapsulation layer 120 is located on the second electrode 116. The encapsulating layer 120 suppresses the permeation of the oxygen and moisture from the outside to suppress the oxidation of a light emitting material and an electrode material. When the organic light emitting element is exposed to the moisture or oxygen, pixel shrinkage phenomenon in which the emission area is reduced is caused or a dark spot is generated in the emission area. The encapsulating layer may be configured by an inorganic film formed of glass, metal, aluminum oxide (AlOx), or a silicon (Si) based material or have a structure in which an organic layer 122 and inorganic layers 121 and 123 are alternately laminated. In this case, the inorganic layers 121 and 123 serve to block the permeation of moisture or oxygen and the organic layer 122 serves to planarize surfaces of the inorganic layers 121 and 123. When the encapsulation layer is formed by a plurality of thin film layers, a moving path of moisture or oxygen is longer and more complex than that of a single layer so that it is difficult for the moisture/oxygen to permeate thereinto.

A barrier film may be located on the encapsulation layer 120 to encapsulate the entire base layer 101. The barrier film may be a retardation film or an optically isotropic film. In this case, an adhesive layer may be located between the barrier film and the encapsulation layer 120. The adhesive layer bonds the encapsulation layer 120 and the barrier film. The adhesive layer may be a thermosetting adhesive or a natural curing adhesive. For example, the adhesive layer may be configured by a material such as a barrier pressure sensitive adhesive (B-PSA).

The second area A2 does not include a light emitting element, but includes a bypass line (not illustrated), a blocking structure 190, and a cut structure 195 to block mutual influence between the first area A1 and the third area A3.

The bypass line is configured to extend various wiring lines which pass through the first area A1 in a horizontal direction or a vertical direction to bypass the first area A1. The bypass line may be configured on the same layer as the original line or a different layer therefrom.

The blocking structure 190 is provided to suppress the organic layer 122 of the encapsulation layer 120 from overflowing into the first area A1. Even though in FIG. 2, it is illustrated that the flow of the organic layer 122 is blocked by a blocking structure which is disposed insider than the other blocking structure, between two blocking structures, the organic layer 122 may pass over an inner blocking structure, but may be blocked by an outer blocking structure.

The cut structure 195 is provided to cut the connection of the organic light emitting layer 114. When the organic light emitting layer 114 is exposed to the outside, it may serve as a permeation path of the moisture. In the first area A1, the organic light emitting layer 114 may be exposed to the outside so that the cut structure 195 is necessary. A principle and a structure of the cut structure 195 will be described with reference to FIG. 3A.

Some of functional layers of the third area A3 remains also in the second area A2. Further, when the blocking structure 190 and the cut structure 195 are formed, some of the functional layers may be used. For example, for the blocking structure 190, a material used for the planarization layer 109 and/or the bank 110 may be used, and for the cut structure 195, a material used for the planarization layer 109 may be used.

In the meantime, in the inactive area I/A, various driving circuits (for example, a GIP), electrodes, wiring lines, and functional structures may be located on the base layer 101. Even though in the inactive area I/A, the pixel circuit and the light emitting element are not disposed, the base layer 101 and organic/inorganic functional layers 103, 105, 107, and 109 may be provided. Further, in the inactive area I/A, materials used for the configuration of the active area A/A may be disposed for a different purpose. For example, the same metal as the gate electrode of the TFT of the active area or the same metal as the source/drain electrode may be disposed in the inactive area I/A for the wiring lines or the electrodes. More, the same metal as one electrode (for example, anode) of the organic light emitting diode may be disposed in the inactive area I/A for the wiring lines and the electrodes.

Figure 3A:
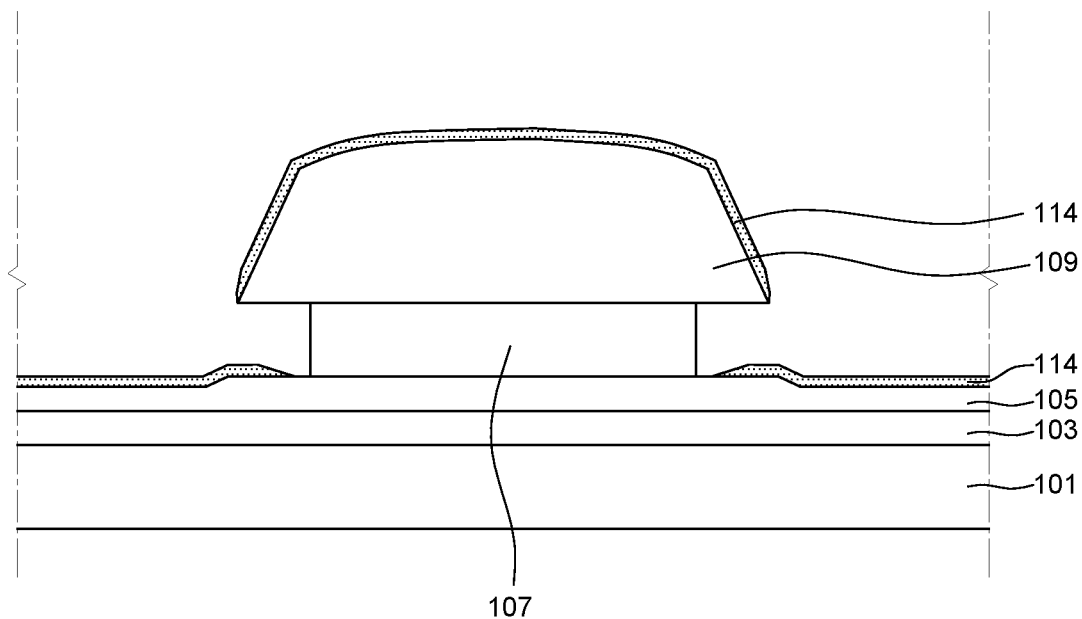
FIGS. 3A and 3B are exemplary views illustrating a cut structure of a display device according to an exemplary embodiment of the present disclosure.
Figure 3B:
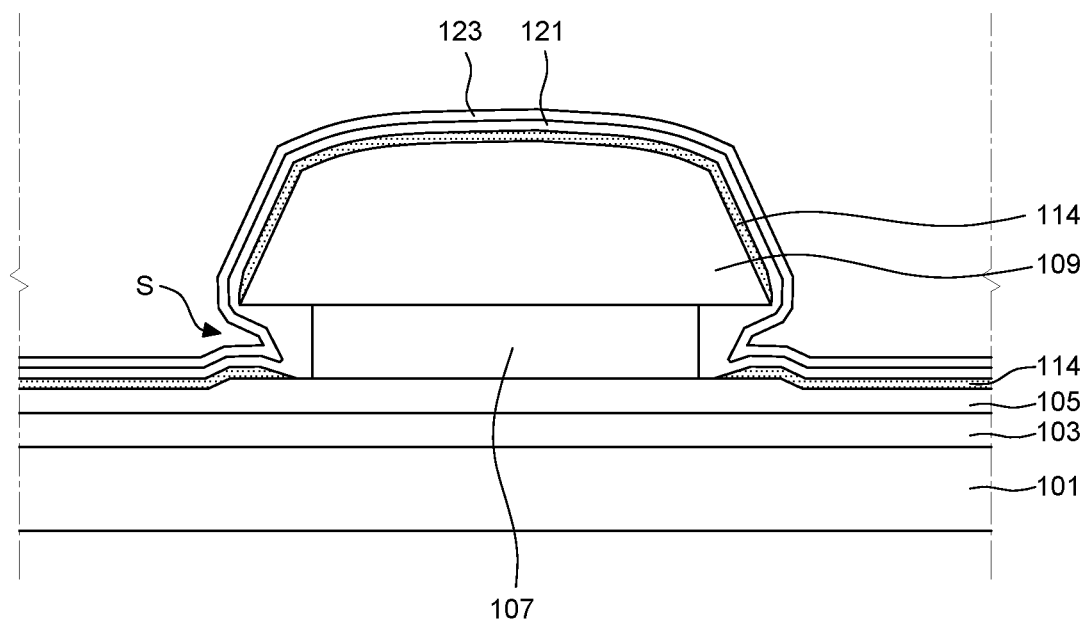

FIGS. 3A and 3B are exemplary views illustrating a cut structure 195 of a display device according to an exemplary embodiment of the present disclosure.

FIGS. 3A and 3B are enlarged views of the second area A2 and elements other than the cut structure are omitted.

The cut structure 195 may include at least two protruding structures, and in FIGS. 3A and 3B, only some of the protruding structures is illustrated. The cut structure 195 may be formed of the same material as the planarization layer 109 which covers the source electrode or the drain electrode of the thin film transistor TFT. That is, the cut structure 195 may be made of the planarization layer 109 on the interlayer dielectric layer 107 to have a columnar shape. The dielectric layer 107 below an outer periphery of the column may be removed. Even though in the drawing, it is illustrated that only one dielectric layer 107 is removed, if necessary, dielectric layers 105 and 103 therebelow may also be removed. The removing process may be performed by a dry etching process or a wet etching process.

When the dielectric layer below the outer peripheral portion of the cut structure is removed (under cut) more inwardly, a layer (for example, reference numeral 114) deposited on the upper portion of the cut structure does not entirely cover below the outer peripheral portion of the cut structure. Therefore, as illustrated in the drawing, disconnection occurs. Using the above-described phenomenon, a lower layer of the cut structure is partially removed to isolate a specific layer. As described above, the organic light emitting layer 114 serves as a moisture transferring path to cause the defect of the display device so that a preventive structure such as the cut structure 195 of the present disclosure is very useful.

In the meantime, the inventors found that the cut structure of the organic light emitting layer had some vulnerabilities. One of them is that when some inorganic layers are further laminated on the cut structure, a recessed boundary S which is also referred to as a seam may be generated. The steeper a side surface slope of the cut structure, the more effectively the layers deposited thereon are disconnected, but in contrast, the boundary portion S appears in the form of a deeper valley. Therefore, the boundary portion S is more vulnerable to an impact than the other portions, so that the boundary portion may be easily cracked. Further, when a damage occurs, the moisture may permeate therethrough. Accordingly, complementary shapes/structures are required to suppress such vulnerabilities from occurring in the cut structures, and the inventors who recognized the problems have devised such crack preventive structures.

Figure 4A:
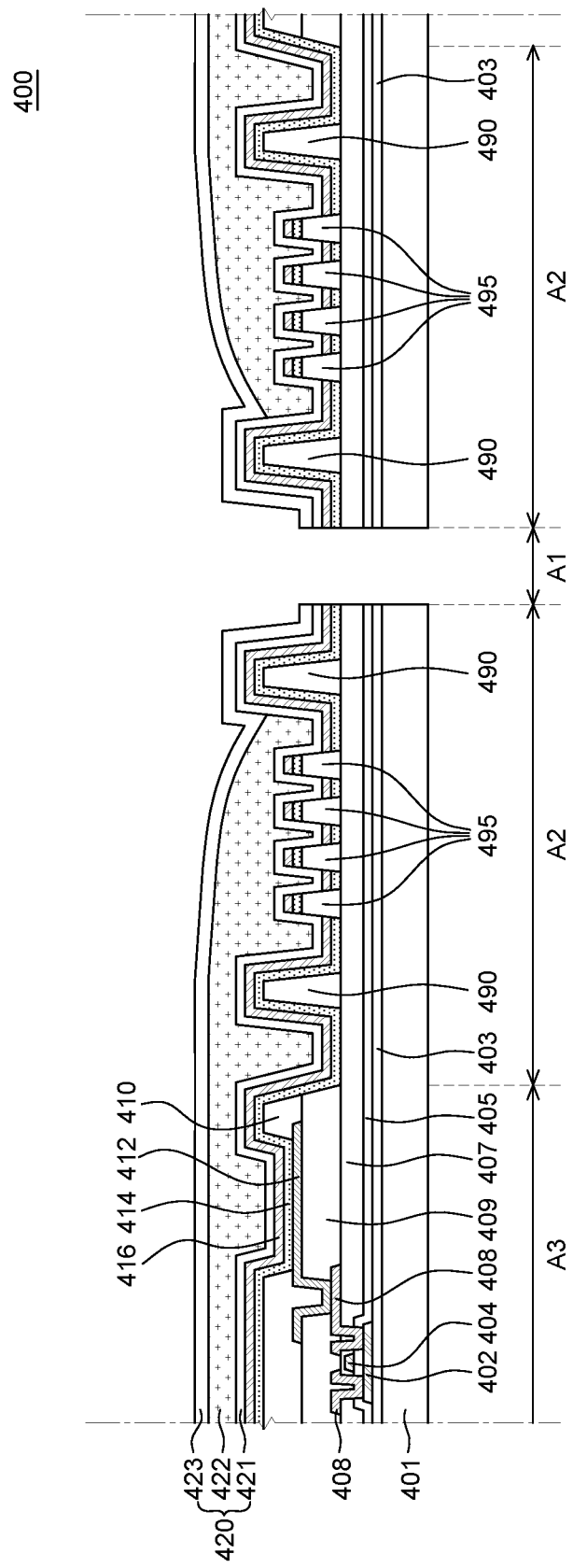
FIGS. 4A to 4C are views illustrating a cut structure and a crack preventive structure of a display device according to another exemplary embodiment of the present disclosure.
Figure 4B:
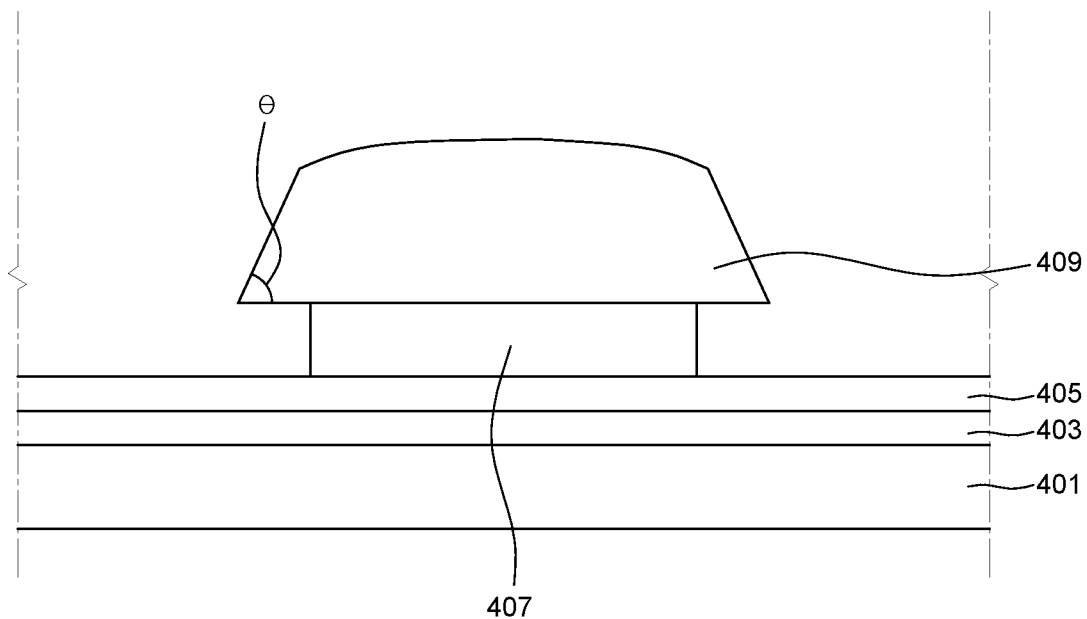
Figure 4C:
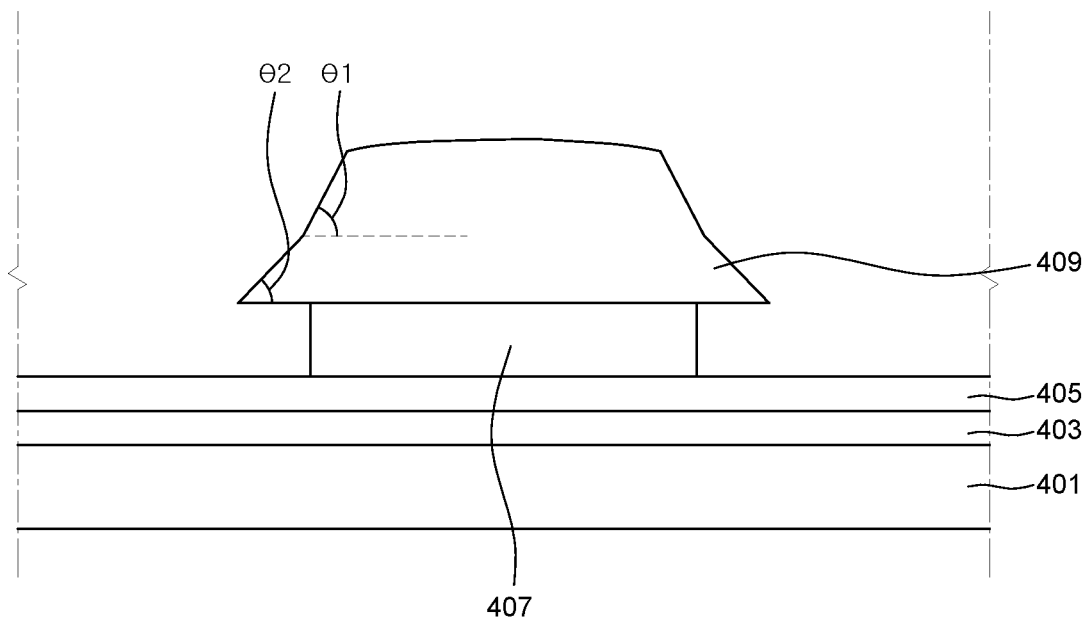

FIGS. 4A to 4C are views illustrating a cut structure and a crack preventive structure of a display device according to another exemplary embodiment of the present disclosure.

Most of components of an exemplary embodiment illustrated in FIG. 4A is the same as those of the exemplary embodiment of FIG. 2. Therefore, description of components of FIG. 4A which are the same as those of FIG. 2 will be omitted. However, in the exemplary embodiment illustrated in FIG. 4A, a position or a shape of a cut structure 495 is different from those in the exemplary embodiment of FIG. 2. Hereinafter, the difference will be mainly described.

The display device 400 may include a first area A1 from which a base layer 401 and functional layers thereon are pierced, a second area A2 which encloses the first area A1, and a third area A3 which encloses the second area A2 and has pixels disposed thereon. In the first area A1, that is, in the position corresponding to an opening, a camera may be provided. In the second area A2, a cut structure 495 which is provided to cut the connection of the organic light emitting layer 414 may be located. In this case, the cut structure 495 is formed to suppress a recessed seam which is generated on the inorganic layers deposited thereabove.

The cut structure 495 is located between the opening (the first area A1) and the light emitting unit (the third area A3) of the active area. The cut structure 495 may be formed of the same material as the planarization layer 409 which covers the source electrode or the drain electrode 408 of the thin film transistor TFT.

The cut structure 495 is provided between the opening and the light emitting unit to cut the connection of the organic light emitting layer 414. A principle of cutting a continuity of the organic light emitting layer 414 by the cut structure 495 is as described with reference to FIG. 3A. To this end, an inorganic insulating layer 407 below the cut structure 495 may be etched more inwardly from an outermost periphery of the cut structure 495 as illustrated in FIG. 4B or 4C.

The cut structure 495 may include at least two protruding structures. FIGS. 4B and 4C are enlarged views of one of the protruding structures. In each of the protruding structures, the inorganic insulating layer 407 therebelow is excavated more inwardly from the outermost periphery of the protruding structure.

The display device 400 includes a base layer 401 which includes an active area partitioned to display images and an inactive area in the vicinity of the active area, an opening which is disposed in a part of the active area and passes through the base layer 401 and a functional layer thereabove, and a cut structure 495 which is located in a vicinity of the opening and provided between the opening and the light emitting unit to cut the connection the organic light emitting layer.

The cut structure has a shape to suppress the inorganic layer which covers the cut structure from being laminated while making a valley shape. The inventors understood that a side surface inclination angle θ of the cut structure (each of the protruding structures) affected the phenomenon as illustrated in FIG. 3B. According to the study result, in the cut structure as illustrated in FIG. 4B, the sharper the side surface slope, the more the seams in the inorganic layer deposited thereabove are generated. In contrast, as the slope is gentler, the phenomenon does not occur. That is, the side surface inclination angle θ is proportional to an occurrence rate of the seam.

Therefore, it is advantageous that the side surface inclination angle of the cut structure is equal to or smaller than a predetermined value. The inventors, through research and experiments, have found that the cut structure does not produce valley shapes and resulting cracks when the side surface inclination angle is 65 degrees (°) or smaller. Further, the inventors have also found that the cut structure forms a large amount of valley shape and cracks resulting therefrom when the side surface inclination angle is 70 degrees (°) or larger. Therefore, the cut structure according to the exemplary embodiment of the present disclosure is formed such that a side surface inclination angle is 65 degrees or smaller. The following Tables 1 and 2 are results of high temperature/humidity reliability experiment according to an inclination angle of the cut structure. The experiments were carried out two times and a number of samples with poor moisture permeation was counted in each experiment.

TABLE 1

| Inclination angle | Number of samples | Number of defective samples (@240 hr) | Number of defective samples (@500 hr) | Number of defective samples (@1000 hr) |
| --- | --- | --- | --- | --- |
| 70 degrees or larger | 15 | 0 | 5 | 1 |
| 65 degrees or smaller | 15 | 0 | 0 | — |

TABLE 2

| Inclination angle | Number of samples | Number of defective samples (@240 hr) | Number of defective samples (@500 hr) | Number of defective samples (@1000 hr) |
|---|---|---|---|---|
| 70 degrees or larger | 9 | 0 | 8 | 1 |
| 65 degrees or smaller | 15 | 0 | 0 | — |

In the meantime, as illustrated in FIG. 4C, the cut structure may have at least two side surface inclination angles θ1 and θ2. In this case, it is advantageous that an inclination angle θ2 of a lower portion of the cut structure is smaller than an inclination angle θ1 of an upper portion of the cut structure. When θ2 is smaller than θ1, the side surface of the cut structure may be formed to be gentler.

The cut structure according to the exemplary embodiment of the present disclosure has a shape as illustrated in FIG. 4B or 4C so that a layer (for example, 423) deposited above the cut structure 495 does not cause a valley shape so that a boundary gap as illustrated in FIG. 3B may be suppressed.

The display device 400 according to the exemplary embodiment may further include an encapsulation layer 420 which covers the active area. The encapsulation layer 420 may include a first inorganic layer 421, an organic layer 422, and a second inorganic layer 423 which are sequentially laminated.

The display device 400 according to the exemplary embodiment may further include a blocking structure 490 which controls the flow of the organic layer 422, in the second area A2. In this case, the blocking structure 490 may be located between the cut structure 495 and the light emitting unit of the active area. Alternatively, the blocking structure 490 may be located between the cut structure 495 and the opening. That is, the cut structure 495 may be located inside or outside the blocking structure 490 and in some exemplary embodiments, the cut structure 495 may be provided on both sides of the blocking structure 490, or, as illustrated in FIG. 4A, the cut structure 495 may be provided between two blocking structures 490. In this case, two blocking structures 490 may have different heights and a height of the blocking structure 490 closer to the opening may be higher. In order to manufacture the blocking structures having different heights, a lower blocking structure may be formed only by the planarization layer 409 and a higher blocking structure may be formed by the planarization layer 409 and the bank layer 410.

Figure 5A:
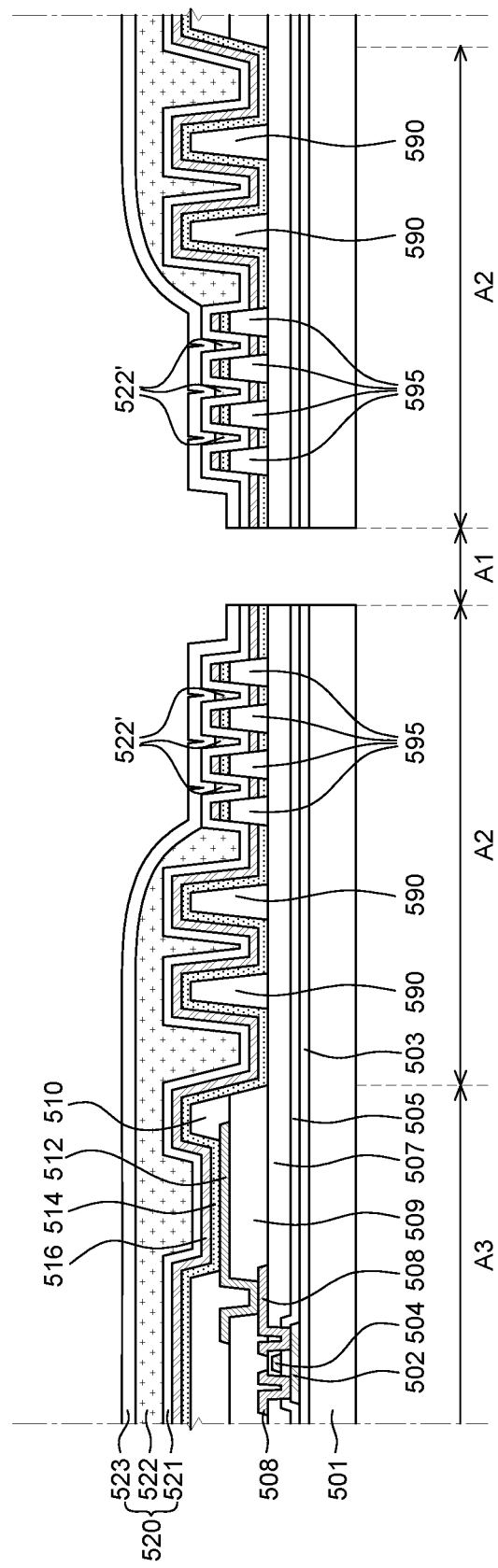
FIGS. 5A to 5C are views illustrating a cut structure and a crack preventive structure of a display device according to still another exemplary embodiment of the present disclosure.
Figure 5B:
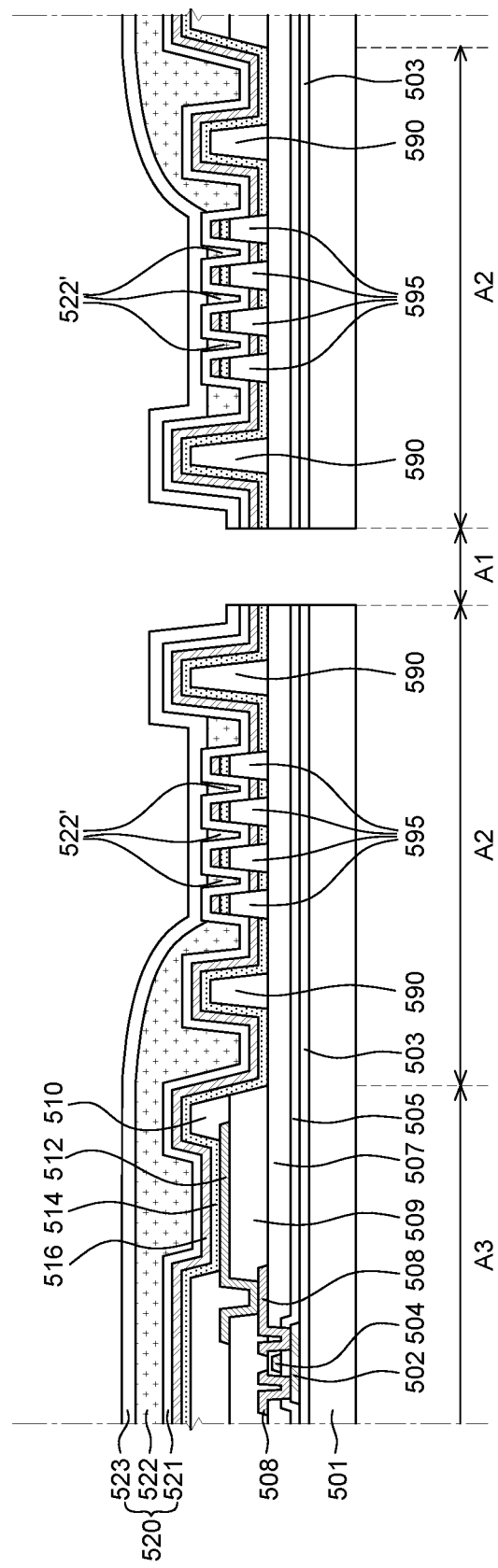
Figure 5C:
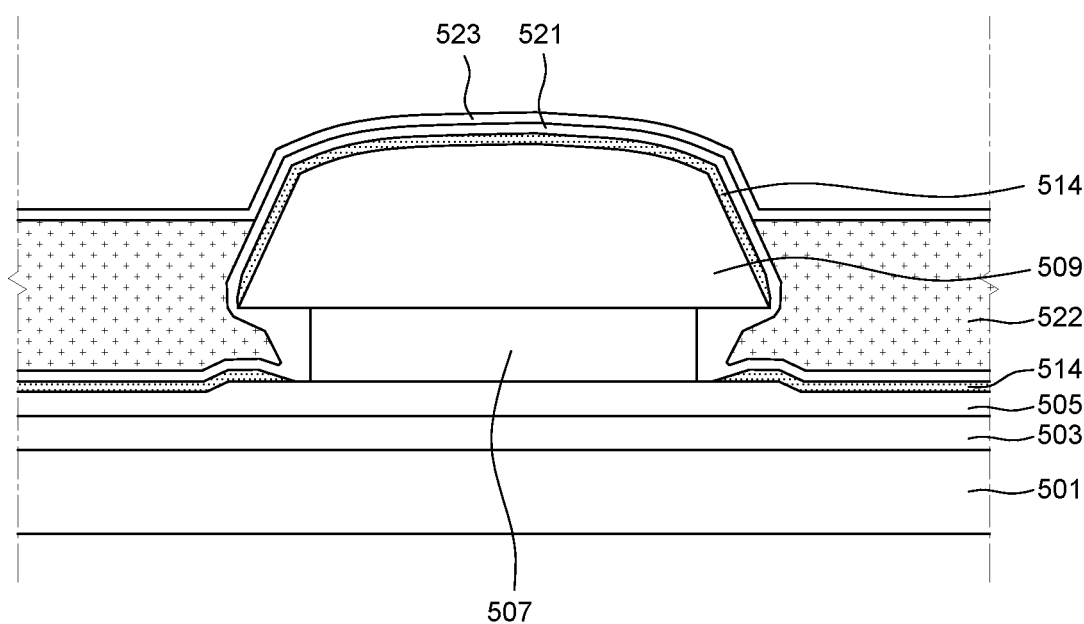

FIGS. 5A to 5C are views illustrating a cut structure and a crack preventive structure of a display device according to still another exemplary embodiment of the present disclosure.

Most of components of an exemplary embodiment illustrated in FIG. 5A is the same as those of the exemplary embodiment of FIG. 2. Therefore, description of components of FIG. 5A which are the same as those of FIG. 2 will be omitted. However, an organic layer 522 and a second inorganic layer 523 thereabove of the encapsulation layer 520 are different from those in the exemplary embodiment of FIG. 2. Accordingly, the periphery of a cut structure 595 of FIG. 5A is different from that of FIG. 2. Hereinafter, the difference will be mainly described.

The display device may include a base layer 501 which includes an active area partitioned to display images and an inactive area in the vicinity of the active area, an opening which is disposed in a part of the active area and passes through the base layer 501 and a functional layer thereabove, and a cut structure 595 which is provided in the vicinity of the opening, and a bumper layer 522' which is adjacent to a side surface of the cut structure 595.

The cut structure 595 is located between the opening (the first area A1) and the light emitting unit (the third area A3) of the active area. The cut structure 595 may be formed of the same material as the planarization layer 509 which covers the source electrode or the drain electrode 508 of the thin film transistor TFT included in the pixel circuit of the active area.

The cut structure 595 is provided to cut the connection of the organic light emitting layer 514 between the opening and the light emitting unit. A principle of cutting a continuity of the organic light emitting layer 514 by the cut structure 595 is as described with reference to FIG. 3A. To this end, an inorganic insulating layer 507 below the cut structure 595 may be etched more inwardly from an outermost periphery of the cut structure 595 as illustrated in FIG. 5C.

The cut structure 595 may include at least two protruding structures. FIG. 5C is an enlarged view illustrating one of the protruding structures. In each of the protruding structures, the inorganic insulating layer 507 therebelow is excavated more inwardly from the outermost periphery of the protruding structure. The bumper layer 522' is provided between the protruding structures. The bumper layer 522' fills a valley on the side surface of the cut structure 595 and makes a slope of the side surface gentler. Therefore, a layer (for example, 523) deposited on the cut structure 595 and the bumper layer 522' is not rolled into the valley therebelow, thereby suppressing the creation of a boundary gap as shown in FIG. 3B.

The display device according to the exemplary embodiment may further include an encapsulation layer 520 which covers the active area. The encapsulation layer 520 may include a first inorganic layer 521, an organic layer 522, and a second inorganic layer 523 which are sequentially laminated. In this case, the bumper layer 522' may be formed of the same material as a part of the encapsulation layer, for example, the organic layer 522. With this configuration, the bumper layer 522' may be disposed between the first inorganic layer 521 and the second inorganic layer 523. The bumper layer 522' may be coated together with the organic layer 522 or filled between the protruding structures by a separate process (for example, a dotting process).

The display device according to the exemplary embodiment may further include a blocking structure 590 which controls the flow of the organic layer 522, in the second area A2. In this case, the blocking structure 590 may be located between the cut structure 595 and the light emitting unit of the active area. Alternatively, the blocking structure 590 may be located between the cut structure 595 and the opening. That is, the cut structure 595 may be located inside or outside the blocking structure 590 and in some exemplary embodiments, the cut structure 595 may be provided on both sides of the blocking structure 590, or, as illustrated in FIG. 5B, the cut structure 595 may be provided between two blocking structures 590. In this case, two blocking structures 590 may have different heights and a height of the blocking structure 590 closer to the opening may be higher. In order to manufacture the blocking structures having different heights, a lower blocking structure is formed only by the planarization layer 509 and a higher blocking structure may be formed by the planarization layer 509 and the bank layer 510.

The display device may include a first area A1 from which a base layer and functional layers thereon are pierced, a second area A2 which encloses the first area A1, and a third area A3 which encloses the second area A2 and has pixels disposed thereon. A camera may be provided in the first area A1. In the second area A2, a cut structure 595 which is provided to cut the connection of the organic light emitting layer 514 and a crack preventive structure 522' adjacent to the cut structure 595 may be located. The crack preventive structure 522' is provided to suppress a recessed boundary (seam) caused in the inorganic layers deposited above the cut structure 595 due to the shape of the cut structure 595.

The crack preventive structure 522' may be provided on the dielectric layer. In this case, at least one of the dielectric layers 503, 505, and 507 below the cut structure 595 may be provided inward from the outer periphery of the cut structure 595, which is to cut the organic light emitting layer as illustrated in FIG. 3A.

The crack preventive structure 522' includes a bumper layer adjacent to the side surface of the cut structure 595. The cut structure 595 includes at least two protruding structures and the crack preventive structure 522' is located between the protruding structures.

The display device may further include an encapsulation layer 520 which covers a light emitting pixel of the third area A3. The encapsulation layer 520 may include a first inorganic layer 521, an organic layer 522, and a second inorganic layer 523 which are sequentially laminated. In this case, the crack preventive structure 522' may be formed of the same material as a part of the encapsulation layer, for example, the organic layer 522. With this configuration, the crack preventive structure 522' is disposed between the first inorganic layer 521 and the second inorganic layer 523.

The structure described above may provide a display device which is safe from a damage (for example, crack) which occurs due to an impact during the process of generating the opening or thereafter. Further, the structure may reduce the element defects due to the moisture permeation.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a base layer including an active area partitioned to display images and an inactive area adjacent to the active area;
    an opening located in a part of the active area and passing through the base layer and functional layers thereabove; and
    a cut structure located in a vicinity of the opening and provided to cut a connection of an organic light emitting layer between the opening and a light emitting unit of the active area,
    wherein the cut structure includes at least a first insulating layer on an insulator, and a second insulating layer on and contacting the first insulating layer, the first insulating layer between the second insulating layer and the insulator, wherein the second insulating layer is farther from the insulator than the first insulating layer,
    wherein a side surface of the second insulating layer protrudes further than a side surface of the first insulating layer,
    wherein the second insulating layer is non-overlapping with at least a portion of the side surface of the first insulating layer to expose the portion of the side surface of the first insulating layer, and
    wherein an inclination of the side surface of the second insulating layer of the cut structure is 65 degrees or smaller.

2. The display device according to claim 1, wherein the cut structure has a shape to suppress an inorganic layer which covers the cut structure from being laminated while making a valley shape.

3. The display device according to claim 2, further comprising:
    an encapsulation layer covering the active area,
    wherein the inorganic layer which covers the cut structure is an inorganic layer included in the encapsulation layer.

4. The display device according to claim 1, wherein the cut structure is located between the opening and the light emitting unit of the active area to enclose the opening.

5. The display device according to claim 1, wherein the first insulating layer of the cut structure is etched inwardly from an outer periphery of the second insulating layer of the cut structure.

6. The display device according to claim 1, wherein the cut structure includes at least two protruding structures, and each of the at least two protruding structures is formed of a same material as a planarization layer which covers a source electrode or a drain electrode of a thin film transistor (TFT) included in a pixel circuit of the active area.

7. The display device according to claim 1, further comprising:
    an encapsulation layer including a first inorganic layer, an organic layer, and a second inorganic layer sequentially laminated and covering the active area; and
    a blocking structure provided to block a flow of the organic layer, and
    wherein the cut structure is located on one side or both sides of the blocking structure.

8. The display device according to claim 7, wherein two blocking structures are provided, and the cut structure is located between the two blocking structures.

9. The display device of claim 1, wherein the second insulating layer of the cut structure is spaced apart from the insulator.

10. The display device of claim 1, further comprising:
    a thin film transistor (TFT) included in a pixel circuit of the active area, the TFT including a source electrode or a drain electrode; and
    at least a part of a planarization layer on the source electrode or the drain electrode of the TFT,
    wherein the second insulating layer of the cut structure is formed of a same material as the planarization layer.

11. The display device of claim 1, wherein a width of a first portion of the second insulating layer from a first distance from the insulator is wider than a width of a second portion of the second insulating layer from a second distance from the insulator, the second distance larger than the first distance.

12. The display device of claim 1, wherein the side surface of the second insulating layer protrudes further than the side surface of the first insulating layer such that at least a portion of a lower surface of the second insulating layer is exposed.

13. The display device of claim 1, wherein the side surface of the second insulating layer extends in a first direction and a top surface of the second insulating layer extends in a second direction different from the first direction.

14. A display device, comprising:
a base layer including an active area partitioned to display images and an inactive area adjacent to the active area;
a light emitting unit on the base layer and including a first electrode, an organic light emitting layer, and a second electrode;
an encapsulation layer on the light emitting unit and including a first inorganic layer, an organic layer, and a second inorganic layer;
an opening located in a part of the active area and passing through the base layer and functional layers thereabove; and
a cut structure disposed between the opening and the active area; and
at least one blocking structure disposed between the cut structure and the active area,
wherein the cut structure includes a first part and a second part on the first part, and a side surface of the second part protrudes further than a side surface of the first part, the first part between the second part and the base layer, wherein the second part is farther from the base layer than the first part,
wherein the second part is non-overlapping with at least a portion of the side surface of the first part to expose the portion of the first part, and
wherein the first inorganic layer and the second inorganic layer is disposed on the blocking structure.

15. The display device of claim 14, wherein an inclination of a side surface of the second part of the cut structure is 65 degrees or smaller.

16. The display device of claim 14, wherein a top surface of the cut structure is disposed below a top surface of the blocking structure.

17. The display device of claim 14, wherein at least a part of the first inorganic layer and at least a part of the second inorganic layer is disposed on the cut structure.

18. The display device of claim 14, wherein the blocking structure is not disposed in an area between the opening and the cut structure.

19. The display device of claim 14, wherein the side surface of the second part protrudes further than the side surface of the first part such that at least a portion of a lower surface of the second part is exposed.

20. The display device of claim 14, wherein the side surface of the second part extends in a first direction and a top surface of the second part extends in a second direction different from the first direction.

21. A display device, comprising:
a base layer including an active area, a barrier area, and an area where an optical device is seated;
a light emitting unit on the base layer and including a first electrode, an organic light emitting layer, and a second electrode;
a plurality of insulating layers on the base layer;
a cut structure located in the barrier area;
wherein the cut structure includes a first part and a second part on the first part, and a side surface of the second part protrudes further than a side surface of the first part, the first part between the second part and the base layer, wherein the second part is farther from the base layer than the second part,
wherein the second part is non-overlapping with at least a portion of the side surface of the first part to expose the portion of the first part, and
wherein an inclination of the side surface of the second part of the cut structure is 65 degrees or smaller.

22. The display device of claim 21, wherein at least a part of the plurality of insulating layers in the barrier area has a flat surface.

23. The display device of claim 21, wherein the barrier area has no metal layer.

24. The display device of claim 21, wherein the plurality of insulating layers includes a buffer layer, gate insulating layer, and an interlayer insulating layer.

25. The display device of claim 21, further comprising:
an encapsulation layer on the plurality of insulating layers and including a first inorganic layer, an organic layer, and a second inorganic layer.

26. The display device of claim 25, further comprising a blocking structure in the barrier area, wherein the first inorganic layer and the second inorganic layer is disposed on the blocking structure, and the organic layer contacts the blocking structure.

27. The display device of claim 26, wherein a top surface of the cut structure is disposed below a top surface of the blocking structure.

28. The display device of claim 21,
wherein the first part of the cut structure is formed of a same material as an interlayer insulating layer, and
the second part of the cut structure is formed of a same material as a planarization layer which covers a source electrode or a drain electrode of a thin film transistor (TFT) included in a pixel circuit of the active area.

29. The display device of claim 21, wherein the plurality of insulating layers is disposed in the active area and at least a part of the plurality of insulating layers extends beyond the active area.

30. The display device according to claim 21, further comprising a bank on the first electrode of the light emitting unit, wherein at least a part of the organic light emitting layer and at least a part of the second electrode is disposed on the bank.

31. The display device of claim 21, wherein the side surface of the second part protrudes further than the side surface of the first part such that at least a portion of a lower surface of the second part is exposed.

32. The display device of claim 21, wherein the side surface of the second part extends in a first direction and a top surface of the second part extends in a second direction different from the first direction.

* * * * *